(12) United States Patent
Ueda et al.

(10) Patent No.: US 7,425,732 B2
(45) Date of Patent: Sep. 16, 2008

(54) NITRIDE SEMICONDUCTOR DEVICE

(75) Inventors: Tetsuzo Ueda, Osaka (JP); Satoshi Nakazawa, Osaka (JP); Daisuke Ueda, Osaka (JP); Toshiyuki Takizawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 170 days.

(21) Appl. No.: 11/410,920

(22) Filed: Apr. 26, 2006

(65) Prior Publication Data

US 2006/0244003 A1  Nov. 2, 2006

(30) Foreign Application Priority Data

Apr. 27, 2005  (JP) .............................. 2005-129301

(51) Int. Cl.
*H01L 33/00* (2006.01)
(52) U.S. Cl. .............................. 257/103; 257/E33.008; 257/14
(58) Field of Classification Search ................ 257/103, 257/E33.008
See application file for complete search history.

(56) References Cited

U.S. PATENT DOCUMENTS 6,625,187 B1 *  9/2003  Ikoma et al. ............. 372/50.22

2002/0195606 A1 * 12/2002 Edmond et la. ................ 257/79
2006/0091404 A1 *  5/2006 Shen et al. ..................... 257/79

FOREIGN PATENT DOCUMENTS

| JP | 06-314822 | 11/1994 |
| JP | 2003-158337 | 5/2003 |
| JP | 2004-134787 | 4/2004 |

OTHER PUBLICATIONS

Chichibu et al., "Effective band gap inhomogeneity and piezoelectric field in InGaN/GaN multiquantum well structures", Applied Physics Letters 73 (1998) pp. 2006-2008.

* cited by examiner

*Primary Examiner*—Tu-Tu V Ho
(74) *Attorney, Agent, or Firm*—McDermott Will & Emery LLP (57) ABSTRACT

A nitride semiconductor device includes an active layer including a first nitride semiconductor layer and a second nitride semiconductor layer which are periodically stacked, the second nitride semiconductor layer having a different composition from a composition of the first nitride semiconductor layer. An energy at a lower edge of a conduction band in the first nitride semiconductor layer is lower than an energy at a lower edge of a conduction band in the second nitride semiconductor layer, and an energy at an upper edge of a valence band in the first nitride semiconductor layer is lower than an energy at an upper edge of a valence band in the second nitride semiconductor layer.

14 Claims, 6 Drawing Sheets

NITRIDE SEMICONDUCTOR DEVICE

CROSS-REFERENCE TO RELATED APPLICATION

The disclosure of Japanese Patent Applications No. 2005-129301 filed on Apr. 27, 2005 and No. 2006-115155 including specification, drawings and claims are incorporated herein by reference in its entirety.

BACKGROUND OF THE INVENTION

The present invention relates to a nitride semiconductor device such as a nitride semiconductor light emitting device applicable to, for example, a short wavelength light emitting diode or a blue-violet semiconductor laser and a nitride semiconductor photo detector device capable of receiving visible light or ultraviolet light.

GaN based group III-V nitride semiconductor (which will be hereafter referred to as merely "nitride semiconductor") have a large bandgap, i.e., 3.4 eV at room temperature in GaN, and a pn junction or double hetero junction structure can be easily formed. For this reason, nitride semiconductor is applicable to light emitting devices such as a visible region light emitting diode and a short wavelength semiconductor laser. GaN based light emitting devices have been in practical use, and research and development for further improving device properties of GaN based light emitting devices have been intensively conducted. As for light emitting diode, blue, green and white light emitting diodes have been already introduced to the market. Also, as for semiconductor lasers, blue-violet semiconductor lasers have been developed as commercial products for use in next generation optical disk systems. To extend application fields of GaN based light emitting devices, longer luminescent wavelength of light emitting devices is one of technical challenges. For example, the luminescent wavelength larger than the wavelength in the green region is strongly desired.

In the history of development of GaN based light emitting devices, the improvement of device performance is largely dependent on crystal growth technology mainly by metal organic chemical vapor deposition (MOCVD). Specifically, progress of the material technologies such as hetero epitaxial growth using a low temperature buffer layer on a sapphire substrate, InGaN multiple quantum well active layers and low resistance p-type GaN growth with subsequent an activation annealing has contributed to the improvement of device performance. To enable longer wavelength of emitted light, it will be essential to improve the quality of the quantum well structure or propose a new active layer structure.

Hereafter, a blue light emitting diode, which is a known nitride semiconductor light emitting device using a sapphire substrate, will be described with reference to FIGS. 10 and 11 (see, for example, Japanese Laid-Open Publication No. 6-314822).

Figure 10:
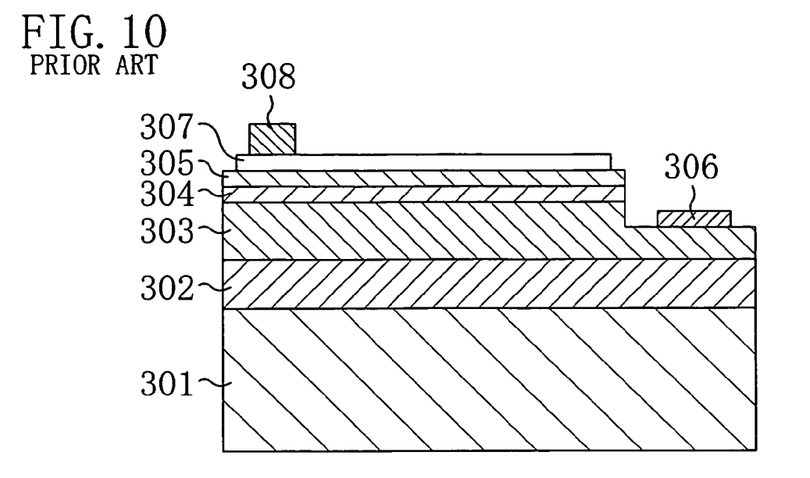
FIG. 10 is a cross-sectional view illustrating a structure of a light emitting diode according to a known example.
Figure 11:
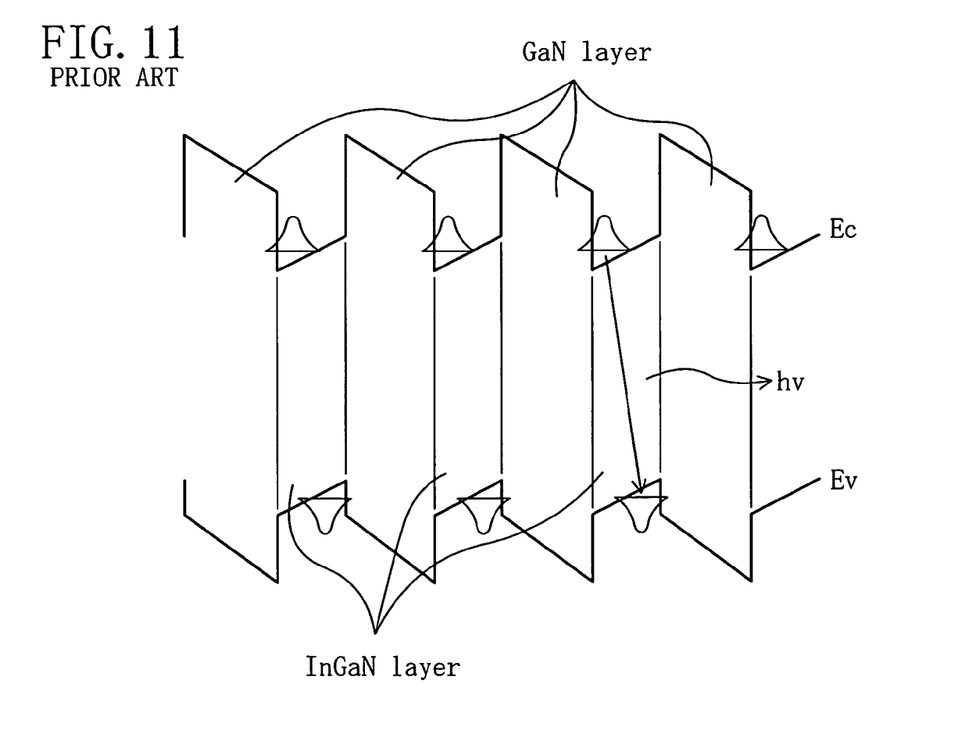
FIG. 11 is an illustration of a band diagram in part of the light emitting diode located around a quantum well active layer in the known example.

FIG. 10 is a cross-sectional structure of a light emitting diode using nitride semiconductor in the known nitride semiconductor device. FIG. 11 is an illustration of a band diagram in part of the light emitting diode located around a quantum well active layer in the known example. In FIG. 10, 301 denotes a C plane sapphire substrate, 302 denotes an n-type GaN layer, 303 denotes an n-type AlGaN cladding layer, 304 denotes an InGaN/GaN multiple quantum well active layer, 305 denotes a p-type AlGaN cladding layer, 306 denotes a Ti/Al electrode, 307 denotes a Ni/Au transparent electrode and 308 is an Au electrode.

Hereafter, a method for fabricating the light emitting diode of FIG. 10 will be described. First, an n-type GaN layer 302, an n-type AlGaN cladding layer 303, an InGaN/GaN multiple quantum well active layer 304 and a p-type AlGaN cladding layer 305 are formed in this order on a sapphire substrate 301, for example, by MOCVD. Subsequently, for formation of an electrode on the n-type layer side of this wafer, etching, specifically, dry etching using, for example, $Cl_2$ gas is performed to the wafer to remove parts of the p-type AlGaN cladding layer 305, the InGaN/GaN multiple quantum well activation layer 304 and the n-type AlGaN cladding layer 303. Then, a Ti/Al electrode 306 is formed in the n-type layer side so as to be in contact with the n-type AlGaN cladding layer 303 and a Ni/Au transparent electrode 307 is formed on the p-type layer side. In this case, the thickness of the Ni/Au transparent electrode 307 has to be 10 nm or less so as to serve as a transparent electrode. Subsequently, to form a p-type layer side bonding pad, an Au electrode 308 is selectively formed on the Ni/Au transparent electrode 307. With use of a transparent electrode, for example, a large portion of blue emission light of 470 nm emitted from the InGaN/GaN multiple quantum well active layer 304 passes through the Ni/Au transparent electrode 307 and is drawn to the outside. The band diagram of active layer part of the light emitting diode structure of FIG. 10 is shown in FIG. 11. In FIG. 11, part of the wafer which is closer to an outer surface thereof is shown in the left hand side and part of the wafer which is closer to the substrate is shown in the right hand side. When the active layer of FIG. 11 is formed on a C plane, i.e., (0001) plane, spontaneous polarization occurs in GaN while piezoelectric polarization which is caused by crystal strain due to lattice mismatch and spontaneous polarization occur in InGaN (see, for example, S. F. Chichibu et al., Applied. Physics. Letters 73 (1998) pp. 2006-2008). Those polarizations cause the generation of an internal electric field in the active layer. As a result, the active layer has a structure in which electrons are accumulated in part of the InGaN layer which is closer to an outer surface of the wafer and holes are accumulated in part of the InGaN layer which is closer to the substrate.

However, in the known light emitting diode of FIG. 10, for example, when emission of long wavelength light such as green light (of 550 nm) is intended, an In composition of the InGaN layer used in a well layer for forming an active layer has to be, for example, about 35% or more. Thus, there arise problems with respect to crystal growth, such as crystal dislocations caused by lattice mismatch between the InGaN well layer and the GaN layer and In segregation in the InGaN well layer. Accordingly, crystal quality of the active layer is worsened and improvement of luminous efficiency is limited. Another problem is that due to the internal electric field, electrons and holes are spatially separated from each other in the InGaN well layer, so that luminous efficiency is reduced.

SUMMARY OF THE INVENTION

In view of the above-described technical issues, the present invention has been devised. It is therefore an object of the present invention is to provide an active layer having a quantum well structure which allows realization of a light emitting device capable of emitting light of a long wavelength at high efficiency while in a semiconductor device using nitride semiconductor, lattice mismatch in the semiconductor device is reduced as much as possible and an In composition of nitride semiconductor constituting the semiconductor device is suppressed at a relatively low level. It is another object of the present invention to provide a photo detector device which is capable of detecting light in the visible region and in which the active layer is used as a light detecting layer.

To solve the above-described problems, a nitride semiconductor light emitting device and a nitride semiconductor photo detector device according to an aspect of the present invention are formed so as to have an active layer structure in which an InAlGaN quaternary alloy crystal layer lattice-matched to a GaN layer and an AlGaN layer are periodically stacked. In each of the nitride semiconductor light emitting device and the nitride semiconductor photo detector device, respective compositions of the InAlGaN quaternary alloy crystal layer and the AlGaN layer are set so that electron affinity is larger in the InAlGaN quaternary alloy crystal layer than in the AlGaN layer and the InAlGaN quaternary alloy crystal layer and the AlGaN layer exhibit substantially the same bandgap. Thus, the active layer is formed to be a so-called type II quantum well active layer having the above-described periodic structure in which electrons and holes are separately quantized and confined in different layers. In the type II quantum well active layer, light having smaller energy than energy in respective bandgaps of the InAlGaN quaternary alloy crystal layer and the AlGaN layer constituting an active layer, i.e., long wavelength emission light can be emitted. The InAlGaN quaternary alloy crystal layer can be formed so as to be lattice-matched to the GaN layer by setting the composition of the InAlGaN quaternary alloy crystal layer to be a desired composition. Thus, the InAlGaN quaternary alloy crystal layer can be formed so that crystal strains are suppressed as low as possible. Based on the finding, obtained from an empirical examination conducted by the present inventors, that when an ohmic electrode is formed on an InAlGaN quaternary alloy crystal layer, a potential barrier becomes small and a contact resistance of $1 \times 10^{-6}$ $\Omega cm^2$ or less can be achieved, it is understood that electron affinity of the InAlGaN quaternary alloy crystal layer is large.

With the above-described structure, unlike the known example, the respective compositions of InAlGaN quaternary alloy crystal layer and the AlGaN layer are set so that the active layer is formed to be the type II quantum well active layer and, thus, a wavelength of emission light can be elongated without increasing an In composition. Therefore, emission of light having a long wavelength can be realized with a smaller In composition and without degradation of crystal quality of the active layer. Moreover, a difference in polarization between the InAlGaN quaternary alloy crystal layer and the AlGaN layer can be made smaller than a difference in polarization between the InGaN layer and the GaN layer in the known example. Accordingly, an internal electric field generated in the active layer can be reduced and respective concentrations of electrons and holes confined in the active layer can be increased, so that more highly efficient light emission can be realized. Furthermore, for example, by forming the type II quantum well active layer on a nonpolar plane such as an a plane, i.e., (11-20) plane, more highly efficient light emission can be realized without the active layer being affected by polarization.

Specifically, a nitride semiconductor device according to another aspect of the present invention includes an active layer which includes a first nitride semiconductor layer and a second nitride semiconductor layer periodically stacked, the second nitride semiconductor layer having a different composition from a composition of the first nitride semiconductor layer, and has a structure in which an energy at a lower edge of a conduction band in the first nitride semiconductor layer is lower than an energy at a lower edge of a conduction band in the second nitride semiconductor layer, and an energy at an upper edge of a valence band in the first nitride semiconductor layer is lower than an energy at an upper edge of a valence band in the second nitride semiconductor layer.

With the above-described structure, the active layer becomes a so-called type II quantum well active layer in which electrons are confined in the first nitride semiconductor layer and holes are confined in the second nitride semiconductor layer. Thus, light emission with a smaller energy than an energy in each of respective bandgaps of the first and second nitride semiconductor layers constituting the type II quantum well active layer is possible. Therefore, emission of light having a long wavelength can be realized in a more simple manner.

According to another aspect of the present invention, the nitride semiconductor device may have a structure in which a bandgap in the first nitride semiconductor layer is the same as a bandgap in the second nitride semiconductor layer.

With this structure, confinement of electrons and holes in the type II quantum well active layer is improved, so that more highly efficient light emission can be realized.

According to another aspect of the present invention, the nitride semiconductor device may have a structure in which the active layer is formed over an underlying layer formed on a substrate, and the first nitride semiconductor layer or the second nitride semiconductor layer is formed so as to be lattice-matched to the underlying layer.

With this structure, only crystal strains in the type II quantum well active layer are suppressed. Therefore, more highly efficient light emission can be realized without degradation of crystal quality of the active layer.

According to another aspect of the present invention, the nitride semiconductor device may have a structure in which the first nitride semiconductor layer exhibits a different polarization from a polarization in the second nitride semiconductor layer.

With this structure, for example, when the type II quantum well active layer is formed on a C plane, i.e., (0001) plane, an internal electric field is generated in the type II quantum well active layer and emission of light having a longer wavelength can be realized.

According to another aspect of the present invention, the nitride semiconductor device may have a structure in which the first nitride semiconductor layer is a quaternary alloy crystal layer formed of a compound expressed by a general formula of $In_xAl_yGa_{1-x-y}N$ (where $0<x<1$ and $0<y<1$).

With this structure, for example, by using the first nitride semiconductor layer as an InAlGaN layer lattice-matched to a GaN layer and the second nitride semiconductor layer as an AlGaN layer or an InGaN layer, the type II quantum well active layer formed of a multilayer structure of the InAlGaN quaternary alloy crystal layer and the AlGaN layer or a multilayer structure of the InAlGaN quaternary alloy crystal layer and the InGaN layer can be realized. Therefore, emission of light having a longer wavelength can be realized at higher efficiency.

According to another aspect of the present invention, the nitride semiconductor may have a structure in which the quaternary alloy crystal layer has a composition lattice-matched to a GaN layer.

With this structure, as in the above-described nitride semiconductor light emitting device, the type II quantum well active layer formed of a multilayer structure of the InAlGaN quaternary alloy crystal layer and the AlGaN layer or a multilayer structure of the InAlGaN quaternary alloy crystal layer and the InGaN layer can be realized. Therefore, emission of light having a longer wavelength can be realized at higher efficiency.

According to another aspect of the present invention, the nitride semiconductor device may have a structure in which a y/x value is within the range from 3.5 to 3.7.

With this structure, lattice match between the InAlGaN quaternary alloy crystal layer and the GaN layer can be reproductively obtained. Thus, as in the above-described nitride semiconductor light emitting device, the type II quantum well active layer formed of a multilayer structure in which the InAlGaN quaternary alloy crystal layer and the AlGaN layer or a multilayer structure in which the InAlGaN quaternary alloy crystal layer and the InGaN layer can be realized. Therefore, emission of light having a longer wavelength can be realized at high efficiency.

According to another aspect of the present invention, the nitride semiconductor device may have a structure in which a lattice constant of the first nitride semiconductor layer is different from a lattice constant of the second nitride semiconductor layer.

With this structure, for example, using the first nitride semiconductor layer as an InAlGaN quaternary alloy crystal layer lattice-matched to a GaN layer and the second nitride semiconductor layer as an AlGaN layer having a smaller lattice constant than a lattice constant of the GaN layer or an InGaN layer having a larger lattice constant than the lattice constant of the GaN layer, as in the above-described nitride semiconductor light emitting device, the type II quantum well active layer formed of a multilayer structure of the InAlGaN quaternary alloy crystal layer and the AlGaN layer or a multilayer structure of the InAlGaN quaternary alloy crystal layer and the InGaN layer can be realized. Therefore, emission of light having a long wavelength can be realized at high efficiency.

According to another aspect of the present invention, the nitride semiconductor device may have a structure in which the second nitride semiconductor layer is a binary alloy crystal layer or a ternary alloy crystal layer formed of a compound expressed by a general formula of $Al_xGa_{1-x}N$ (where $0 \leq x \leq 1$) or is a binary alloy crystal layer or a ternary alloy crystal layer formed of a compound expressed by a general formula of $In_xGa_{1-x}N$ (where $0 < x \leq 1$).

With this structure, as in the above-described nitride semiconductor light emitting device, the type II quantum well active layer formed of a multilayer structure of the InAlGaN quaternary alloy crystal layer and the AlGaN layer or a multilayer structure of the InAlGaN quaternary alloy crystal layer and the InGaN layer can be realized. Therefore, emission of light having a longer wavelength can be realized at high efficiency.

According to another aspect of the present invention, the nitride semiconductor device may have a structure in which the first nitride semiconductor layer and the second nitride semiconductor layer are stacked on a nonpolar plane containing nitride atoms and group III atoms in equal numbers.

With this structure, the type II quantum well active layer can be formed without generating an internal electric field due to polarization, so that localization of electrons and holes confined in the active layer at a hetero interface can be suppressed. Therefore, highly efficiency light emission can be realized.

According to another aspect of the present invention, the nitride semiconductor device may have a structure in which the substrate is formed of sapphire, SiC or a compound expressed by a general formula of $In_xAl_yGa_{1-x-y}N$ (where $0 \leq x \leq 1$ and $0 \leq y \leq 1$), and the underlying layer is formed of GaN.

With this structure, the type II quantum well active layer in which the first and second nitride semiconductor layers having more excellent crystal quality are stacked can be formed. Thus, emission of light having a longer wavelength can be realized at high efficiency.

According to another aspect of the present invention, the nitride semiconductor device may have a structure in which each of the first nitride semiconductor layer and the second nitride semiconductor layer has a surface of a (0001) plane.

With this structure, as in the case where the type II quantum well active layer is formed on the C plane, i.e., (0001) plane, an internal electric field is generated in the type II quantum well active layer. Therefore, emission of light having a longer wavelength can be realized.

According to another aspect of the present invention, the nitride semiconductor device may have a structure in which each of the first nitride semiconductor layer and the second nitride semiconductor layer has a surface of a (11-20) plane or a (1-100) plane.

With this structure, as in the case where the type II quantum well active layer is formed on the above-described nonpolar plane, the type II quantum well active layer can be formed without generating an internal electric field due to polarization, so that localization of electrons and holes confined in the active layer at a hetero interface can be suppressed. Therefore, more highly efficient light emission can be realized.

According to another aspect of the present invention, the nitride semiconductor device may have a structure in which each of the first nitride semiconductor layer and the second nitride semiconductor layer has a surface of a (11-20) plane, and the first nitride semiconductor layer and the second nitride semiconductor layer are formed over the sapphire substrate including a surface of a (1-102) plane.

With this structure, a nitride semiconductor layer having a surface of an a plane, i.e., (11-20) plane can be formed on an R plane, i.e., (1-102) plane sapphire substrate in a simple manner. Thus, as in the case where the type II quantum well active layer is formed on the above-described nonpolar plane, the type II quantum well active layer can be formed without generating an internal electric field due to polarization, so that localization of electrons and holes confined in the active layer at a hetero interface can be suppressed. Therefore, more highly efficient light emission can be realized.

According to another aspect of the present invention, the nitride semiconductor device may have a structure in which a cladding layer having a lower refractive index than a refractive index of part of the active layer for practically emitting light which exhibits a maximum refractive index is formed over and under the active layer.

With this structure, when the type II quantum well active layer is applied to a semiconductor laser, confinement of light in the active layer can be improved and a semiconductor layer with a low threshold current can be realized.

According to another aspect of the present invention, the nitride semiconductor device may have a structure in which the cladding layer is a binary alloy crystal layer or a ternary alloy crystal layer formed of a compound expressed by a general formula of $Al_xGa_{1-x}N$ (where $0 < x \leq 1$).

With this structure, in the semiconductor laser to which the present invention is applied, the AlGaN layer having a large Al composition is used as a cladding layer. Thus, confinement of light in the active layer is further improved and a semiconductor laser with a lower threshold current can be realized.

As has been described above, in each of the nitride semiconductor light emitting device and the nitride semiconductor photo detector device, the active layer having a periodic structure of the InAlGaN quaternary alloy crystal layer and the AlGaN layer can be formed to be a so-called type II quantum well active layer by preferably setting the respective compositions of the InAlGaN quaternary alloy crystal layer and the AlGaN layer. Thus, unlike the known example, emission of light having a long wavelength can be realized without increasing an In composition. Moreover, by setting the respective compositions of the InAlGaN quaternary alloy crystal layer and the AlGaN layer so that the active layer is formed to be the type II quantum well active layer while lattice matching between the GaN layer and the InAlGaN quaternary alloy crystal layer is achieved, emission of light having a long wavelength can be realized without degrading crystal quality of the active layer. Furthermore, as for a light emitting diode using the active layer having the type II quantum well structure, for example, a green light emitting diode with high luminous efficiency can be realized. As for a nitride semiconductor photo detector device using an active layer having the type II quantum well structure as a photo detector layer, for example, a visible region photo detector device with high light receiving efficiency can be realized.

DESCRIPTION OF THE PREFERRED EMBODIMENTS

Hereafter, embodiments of the present invention will be described with reference to the accompanying drawings.

First Embodiment

Figure 1:
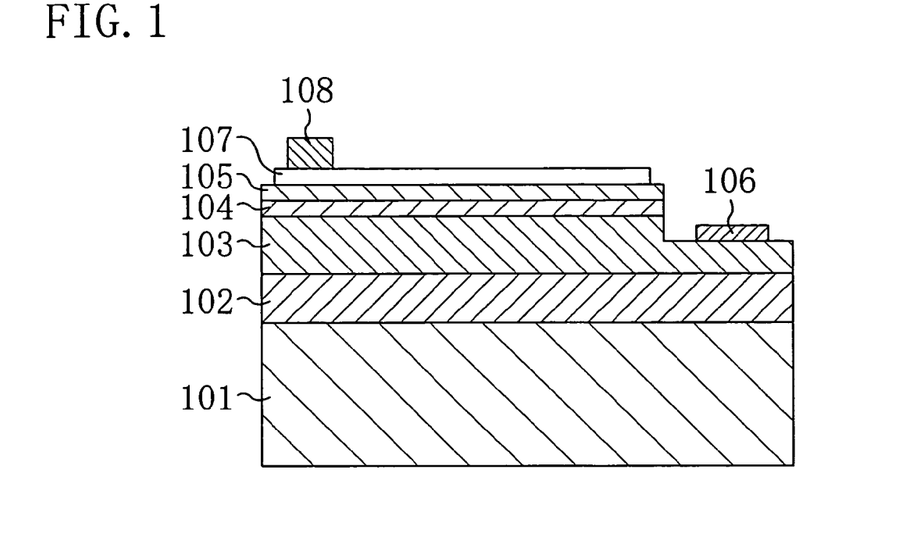
FIG. 1 is a cross-sectional view illustrating a structure of a nitride semiconductor light emitting device according to a first embodiment of the present invention.
Figure 2:
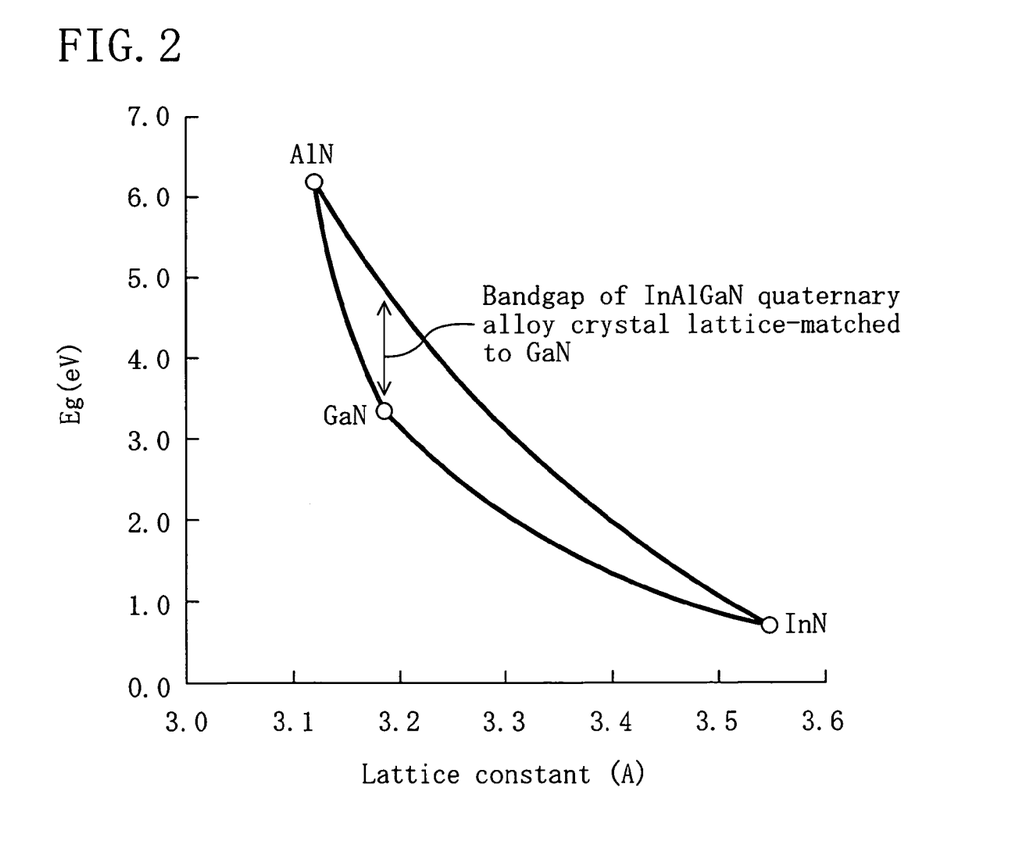
FIG. 2 is a graph showing a bandgap of InAlGaN quaternary alloy crystal layer lattice-matched to GaN used in the present invention and the relationship between lattice constant and bandgap for nitride semiconductor.
Figure 3:
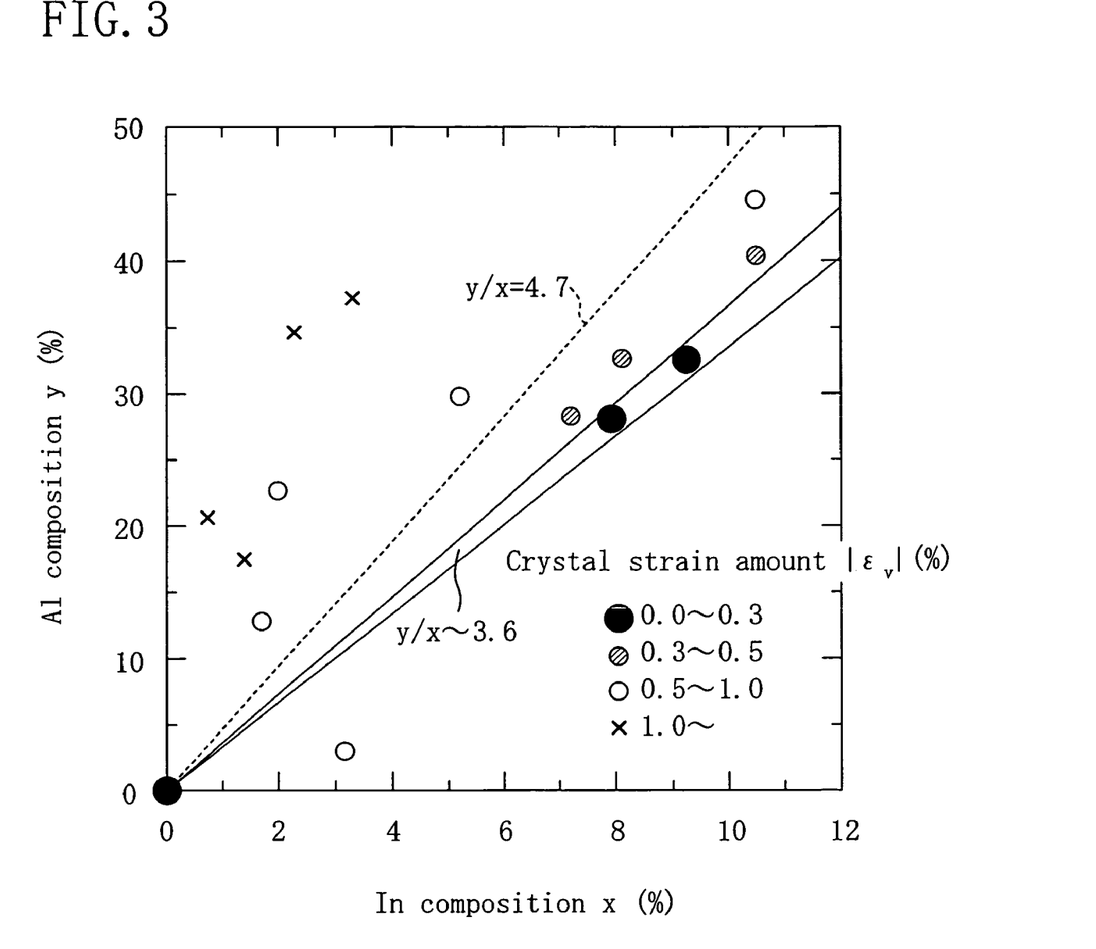
FIG. 3 is a graph obtained by plotting y/x values of $In_xAl_yGa_{1-x-y}N$ quaternary alloy crystals which have been obtained by actual crystal growth for $In_xAl_yGa_{1-x-y}N$ quaternary alloy crystals having different compositions on GaN conducted by the present inventors and then classified by respective crystal strain amounts thereof.
Figure 4:
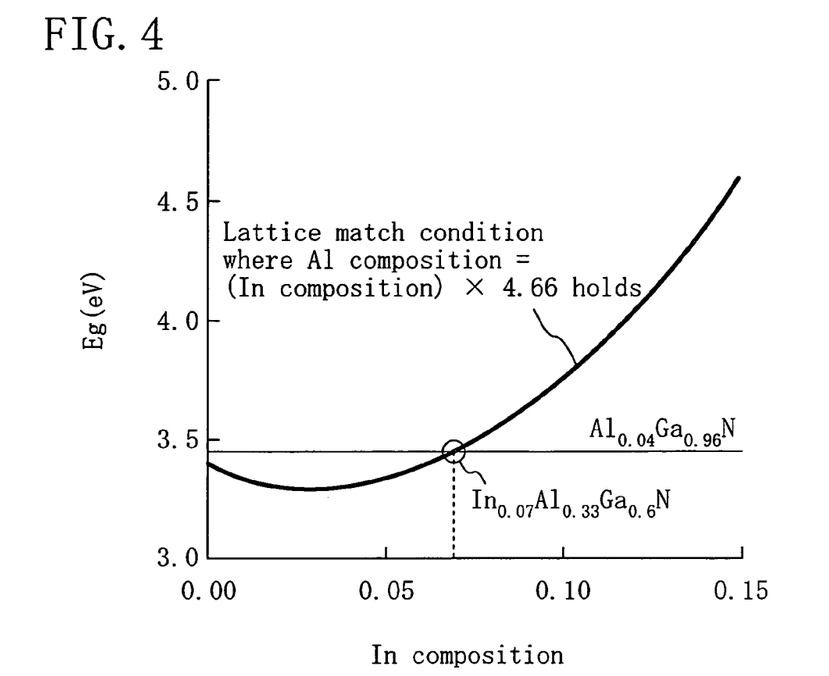
FIG. 4 is a graph showing the dependency of bandgap on In composition for InAlGaN quaternary alloy crystal layer lattice-matched to GaN according to the present invention.
Figure 5:
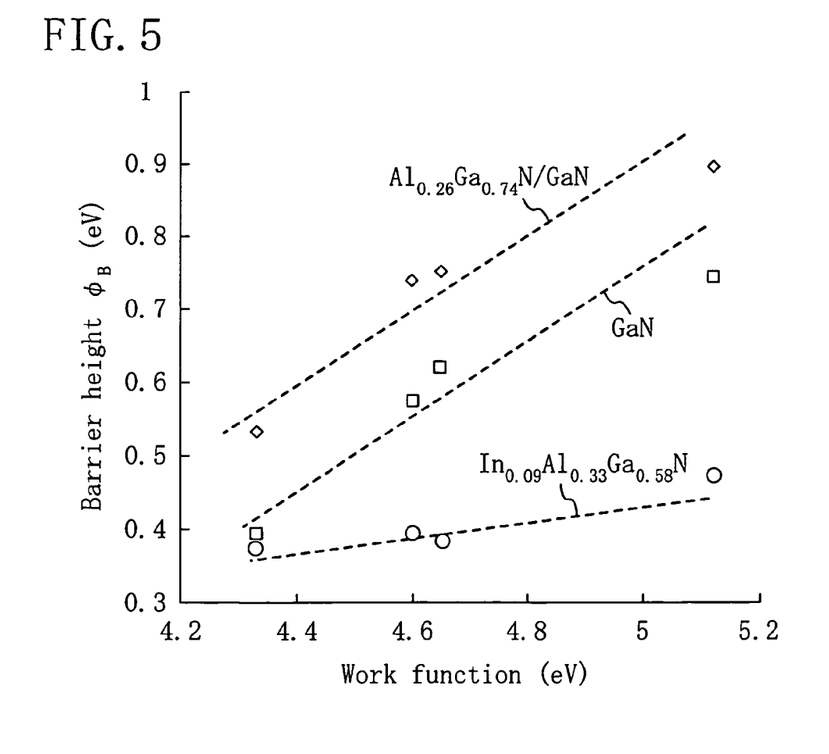
FIG. 5 is a graph showing the relationship between barrier height and work function of metal for Schottky electrodes formed on InAlGaN quaternary alloy crystals lattice-matched to AlGaN/GaN, GaN and InAlGaN according to the present invention.
Figure 6:
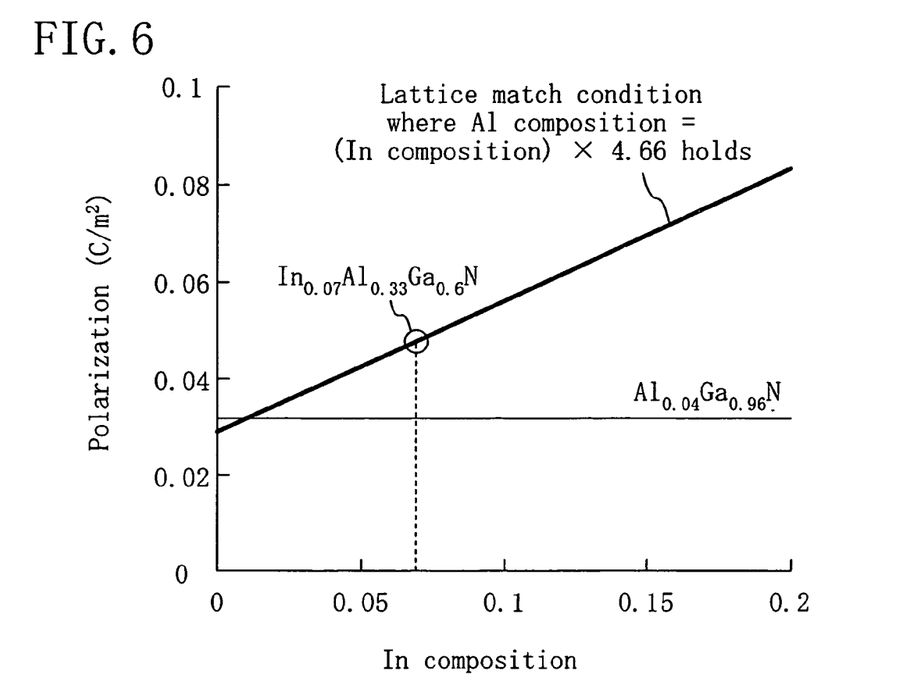
FIG. 6 is a graph showing the dependency of polarization on In composition for InAlGaN quaternary alloy crystal layer lattice-matched to GaN according to the present invention.
Figure 7:
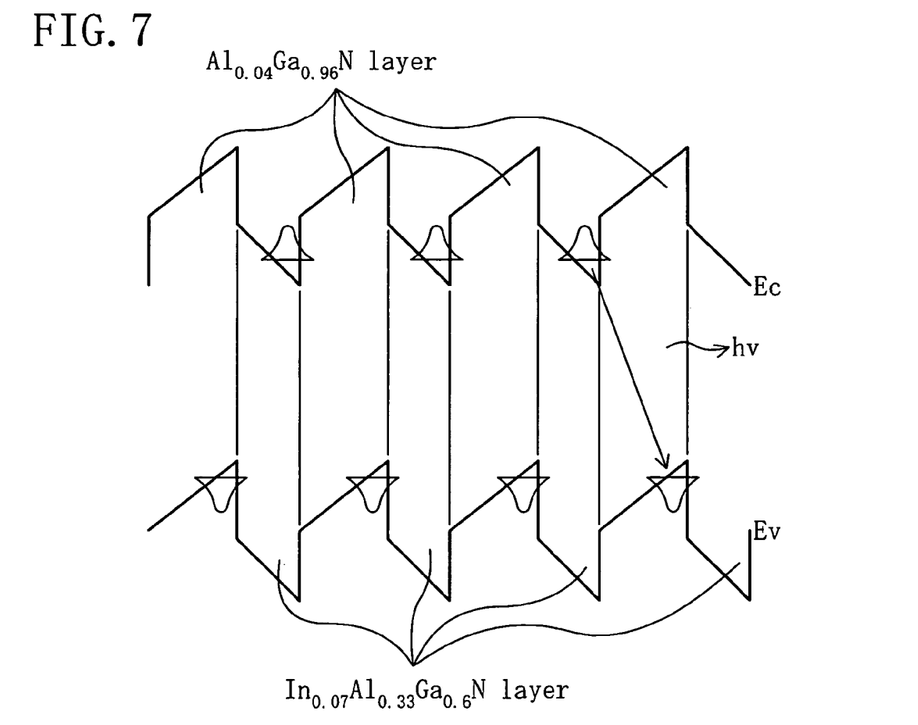
FIG. 7 is an illustration of a band diagram in active layer part of the nitride semiconductor light emitting device of the first embodiment of the present invention.

Hereafter, a first embodiment of the present invention will be described with reference to FIGS. 1 through 7. FIG. 1 is a cross-sectional view illustrating a structure of a nitride semiconductor light emitting device according to the first embodiment of the present invention. FIG. 2 is a graph showing a bandgap of InAlGaN quaternary alloy crystal which is lattice-matched to GaN and used in the present invention and the relationship between lattice constant and bandgap for nitride semiconductor. FIG. 3 is a graph obtained by plotting y/x values of $In_xAl_yGa_{1-x-y}N$ quaternary alloy crystals which have been classified by respective crystal strain amounts thereof. The $In_xAl_yGa_{1-x-y}N$ quaternary alloy crystals were obtained by actual crystal growth of $In_xAl_yGa_{1-x-y}N$ quaternary alloy crystals having different compositions on GaN actually conducted by the present inventors. FIG. 4 is a graph showing the dependency of bandgap on In composition for InAlGaN quaternary alloy crystal when InAlGaN quaternary alloy crystal is formed under the condition where InAlGaN is lattice-matched to GaN and an bowing parameter is 2.6 eV. FIG. 5 is a graph showing the relationship between barrier height and work function of metal for Schottky electrodes formed on AlGaN/GaN, GaN and InAlGaN. FIG. 6 is a graph showing the dependency of polarization on In composition for InAlGaN quaternary alloy crystal formed under the condition where InAlGaN quaternary alloy crystal is lattice-matched to GaN. FIG. 7 is an illustration of a band diagram of active layer part of the nitride semiconductor light emitting device in the first embodiment of the present invention. In FIG. 1, 101 denotes a C plane sapphire substrate, 102 denotes an n-type GaN layer, 103 denotes an n-type $Al_{0.1}Ga_{0.9}N$ cladding layer, 104 denotes an $In_{0.07}Al_{0.33}Ga_{0.6}N/A_{0.04}Ga_{0.96}N$ multiple quantum well active layer, 105 denotes a p-type $Al_{0.01}Ga_{0.9}N$ cladding layer, 106 denotes a Ti/Al/Ni/Au electrode, 107 denotes a Ni/Au transparent electrode and 108 denotes an Au electrode.

A method for fabricating a light emitting diode using an active layer having a periodic structure of the $In_{0.07}Al_{0.33}Ga_{0.6}N$ layer and the $A_{0.04}Ga_{0.96}N$ layer will be described with reference to FIG. 1. First, an n-type GaN layer 102, an n-type AlGaN cladding layer 103, an $In_{0.07}Al_{0.33}Ga_{0.96}N/A_{0.04}Ga_{0.96}N$ multiple quantum well active layer 104 and the p-type AlGaN cladding layer 105 are formed in this order on a C plane sapphire substrate 101, for example, by MOCVD.

Next, this wafer is etched to form an n-type layer side electrode. Specifically, dry etching is performed using, for example, $Cl_2$ gas to remove parts of the p-type AlGaN cladding layer 105, the InAlGaN/AlGaN multiple quantum well active layer 104 and the n-type AlGaN cladding layer 103.

Subsequently, a Ti/Al/Ni/Au electrode 106 is formed in an n-type layer side so as to be in contact with the n-type AlGaN cladding layer 103 and a Ni/Au transparent electrode 107 is formed in a p-type layer side. Furthermore, for formation of a p-type layer side bonding pad, an Au electrode 108 is selectively formed on the Ni/Au transparent electrode 107.

The $In_{0.07}Al_{0.33}Ga_{0.6}N$ layer has a composition lattice-matched to the GaN layer. Also, a bandgap of the $In_{0.07}Al_{0.33}Ga_{0.6}N$ layer is substantially equal to that of the $A_{0.04}Ga_{0.96}N$ layer. Energy at a lower edge of conduction band of the $In_{0.07}Al_{0.33}Ga_{0.6}N$ layer is lower than that at a lower edge of conduction band of the $A_{0.04}Ga_{0.96}N$ layer. Accordingly, the active layer having a multilayer structure of the $In_{0.07}Al_{0.33}Ga_{0.6}N$ layer and the $In_{0.07}Al_{0.33}Ga_{0.6}N$ layer is a layer having a so-called type II quantum well structure (i.e., type II quantum well active layer) in which electrons are confined in the $In_{0.07}Al_{0.33}Ga_{0.6}N/A_{0.04}Ga_{0.96}N$ layer and holes are confined in the $A_{0.04}Ga_{0.96}N$ layer.

A bandgap of InAlGaN quaternary alloy crystal constituting the type II quantum well active layer will be described with reference to FIG. 2. Hereafter, the case where InAlGaN quaternary alloy crystal is formed so as to be lattice-matched to GaN will be considered. As shown in FIG. 2, in so-called nitride compound semiconductor formed of a compound expressed by the general formula: $In_xAl_yGa_{1-x-y}N$ (where $0 \leq x \leq 1$ and $0 \leq y \leq 1$), a bandgap can be changed within a wide range from 0.77 eV of InN (where x=1 and y=0) to 6.2 eV of AlN (where x=0 and y=1). In InAlGaN quaternary alloy crystal layer lattice-matched to GaN, its bandgap can be changed within a wide range from about 3.4 eV to 5 eV, depending on a so-called bowing parameter. Assume that a lattice constant of this $In_xAl_yGa_{1-x-y}N$ quaternary alloy crystal is given by linear interpolation. Then, the lattice constant is obtained based on the following equation:

$$a = x \cdot a_{InN} + y \cdot a_{AlN} + (1-x-y) \cdot a_{GaN} \qquad \text{[Equation 1]}$$

where $a_{InN}$, $a_{AlN}$ and $a_{GaN}$ are respective lattice constants of InN, AlN and GaN. Specifically, $a_{InN}$=0.3548 nm, $a_{AlN}$=0.3112 nm and $a_{GaN}$=0.3189 nm hold. If it is assumed that the lattice constant of $In_xAl_yGa_{1-x-y}N$ quaternary alloy crystal is equal to a lattice constant of GaN, i.e., 0.3189, values of x and y of $In_xAl_yGa_{1-x-y}N$ satisfy the relationship shown by following Equation 2.

$$y = 4.662 \cdot x \qquad \text{[Equation 2]}$$

The bandgap of $In_xAl_yGa_{1-x-y}N$ quaternary alloy crystal is expressed by following Equation 3.

$$Eg = x \cdot Eg_{InN} + y \cdot Eg_{AlN} + (1-x-y) \cdot Eg_{GaN} - c \cdot x \cdot (1-x-y) - c' \cdot y \cdot (1-x-y) \qquad \text{[Equation 3]}$$

where c and c' are so-called bowing parameters. FIG. 3 is a graph obtained by plotting y/x values for $In_xAl_yGa_{1-x-y}N$ quaternary alloy crystals which have been classified by respective crystal strain amounts thereof. The $In_xAl_yGa_{1-x-y}N$ quaternary alloy crystals were obtained by actual crystal growth of $In_xAl_yGa_{1-x-y}N$ quaternary alloy crystals having different compositions on GaN actually conducted by the present inventors. The composition of InAlGaN quaternary alloy crystal is measured by EPMA (electron probe macro-analysis) and a difference in lattice constant between GaN and InAlGaN quaternary alloy crystal is evaluated using an X-ray diffraction pattern and reciprocal lattice mapping, thereby calculating a crystal strain amount of InAlGaN quaternary alloy crystal. FIG. 3 shows that the composition of $In_xAl_yGa_{1-x-y}N$ quaternary alloy crystal of which a crystal strain amount is nearly 0 is close to a composition satisfying the relationship between values of x and y of $In_xAl_yGa_{1-x-y}N$ shown in Equation 4 rather than the composition satisfying the relationship between x and y shown in Equation 2.

$$y = 3.6x \qquad \text{[Equation 4]}$$

Based on a result of evaluation of cathode luminescence and the like, it is also shown that in $In_{0.09}Al_{0.33}Ga_{0.58}N$ which almost satisfies the condition of Equation 4 and has a composition lattice-matched to GaN, a bandgap of $In_{0.09}Al_{0.33}Ga_{0.58}N$ is 3.46 eV. From this result, c=c'=2.6 eV is obtained using Equation 3. Thus, it can be expected that the bandgap is not increased so much even when an In composition and an Al composition are increased. FIG. 4 shows that the dependence of the bandgap of InAlGaN quaternary alloy crystal on its In composition when an In composition and an Al composition are increased, with use of the bowing parameters, while lattice match conditions for causing lattice match to GaN are satisfied. In FIG. 4, as AlGaN ternary alloy crystal having the same bandgap as the bandgap of $In_{0.07}Al_{0.33}Ga_{0.6}N$ used in this embodiment, a bandgap of $Al_{0.04}Ga_{0.96}N$ is also shown.

FIG. 5 is a graph showing the relationship between work function and barrier height $\phi_B$ on semiconductor layer for the InAlGaN layer and the AlGaN layer which are used as semiconductor layers constituting the type II quantum well active layer and the GaN layer according to this embodiment. The relationship between work function and barrier height $\phi_B$ shown in FIG. 5 is based on results of evaluation of respective barrier heights of Schottky electrodes containing different types of metals provided on the semiconductor layers. More specifically, FIG. 5 shows results of measurement of barrier heights of Schottky electrodes on the semiconductor layers using four types of metals, i.e., Mo, Ti, Cu and Pd. With increase in work function of a metal, respective barrier heights on the GaN layer, the AlGaN layer and the InAlGaN layer are all increased. In comparison between the barrier heights on the GaN layer, the AlGaN layer and the InAlGaN layer, the barrier height on the InAlGaN layer is smaller than those of the GaN layer and the AlGaN layer. The barrier height $\phi_B$ is given by $\phi_m - \chi_s$ where $\phi_m$ is a work function of a metal and $\chi_s$ is an electron affinity of a semiconductor layer. Thus, the result of the small barrier height on the InAlGaN layer being small means that the electron affinity of the InAlGaN layer is large.

In general, nitride compound semiconductor is epitaxial grown so as to have a C plane, i.e., (0001) plane and is considered as a material in which polarization is large in the C plane. Polarization includes two types, i.e., spontaneous polarization determined by an elastic constant of a material and piezoelectric polarization caused due to crystal strains in a material. The entire polarization is obtained by the sum of the above-described two types of polarization. In InAlGaN quaternary alloy crystal formed on GaN so as to be lattice-matched, only spontaneous polarization occurs. In contrast, as for AlGaN formed on GaN, crystal strains are generated in AlGaN because respective lattice constants of GaN and AlGaN are different, so that spontaneous polarization and piezoelectric polarization occur. As described in O. Ambacher et al., J. Appl. Phys 85 (1999)3222, polarization can be calculated using an elastic constant and crystal strains. FIG. 6 shows, based on this calculation, the dependency of polarization on In composition for InAlGaN quaternary alloy crystal when an In composition and an Al composition are increased while a lattice match condition (as described above, the Al composition is 4.662 times as large as the In composition) for lattice match to GaN is satisfied. In FIG. 6, polarization in $Al_{0.04}Ga_{0.96}N$ having the same bandgap as the bandgap of $In_{0.07}Al_{0.33}Ga_{0.6}N$ is also shown.

FIG. 7 illustrates a band diagram of the $In_{0.07}Al_{0.33}Ga_{0.6}N/Al_{0.04}Ga_{0.96}N$ multiple quantum well active layer 104. If it is taken into consideration that, as described above, an electron affinity is larger in the InAlGaN layer than in the AlGaN layer, the InAlGaN layer has the same bandgap as that of the AlGaN layer and polarization is larger in the InAlGaN layer than in the AlGaN layer, it can be understood that in the multiple quantum well active layer 104, an internal electric field is generated in an active layer and forms the so-called type II quantum well structure. As has been described, electrons are accumulated in the InAlGaN layer and holes are accumulated in the AlGaN layer. Light emitted from an active layer having an InAlGaN/AlGaN multilayer structure is light having smaller energy than energy in the respective bandgaps of the InAlGaN layer and the AlGaN layer, i.e., long wavelength emission light. In this embodiment, assuming that in the active layer, for example, a band offset in a conduction band, i.e., so-called ΔEc is about 0.3 eV, each of the bandgaps of the InAlGaN layer and the AlGaN layer is 3.46 eV and thus light of 2.86 eV (corresponding to a wave length of 434 nm) or less can be emitted.

As described above, in this embodiment, while achieving lattice match between the GaN layer and the InAlGaN layer, the respective compositions of the InAlGaN layer and the AlGaN layer are set so that the type II quantum well structure is formed. Thus, an active layer can be formed with a smaller In composition and under epitaxial growth conditions where lattice mismatch is less caused, so that emission of light having a longer wavelength can be realized without degradation of crystal quality of the active layer. Accordingly, emission of light having a longer wavelength can be realized with high efficiency.

In this embodiment, the case where the $In_{0.07}Al_{0.33}Ga0.6N/Al_{0.04}Ga_{0.96}N$ multiple quantum well active layer 104 is used has been described. However, the present invention is not limited thereto. For example, even when an InAlGaN/InGaN multiple quantum active layer in which InAlGaN quaternary alloy crystal and InGaN are periodically formed on GaN is used, the type II quantum well structure can be achieved by preferably setting the respective compositions of InAlGaN quaternary alloy crystal and InGaN. In such a case, light having a longer wavelength than light in the case where the multiple quantum well active layer 104 is used can be emitted.

Moreover, in this embodiment, for the purpose of reducing the internal electric field generated in the InAlGaN/AlGaN multiple quantum well active layer 104, an impurity such as Si may be added to InAlGaN or AlGaN so that InAlGaN or AlGaN to which the impurity has been added can be provided with conductivity.

Second Embodiment

Figure 8:
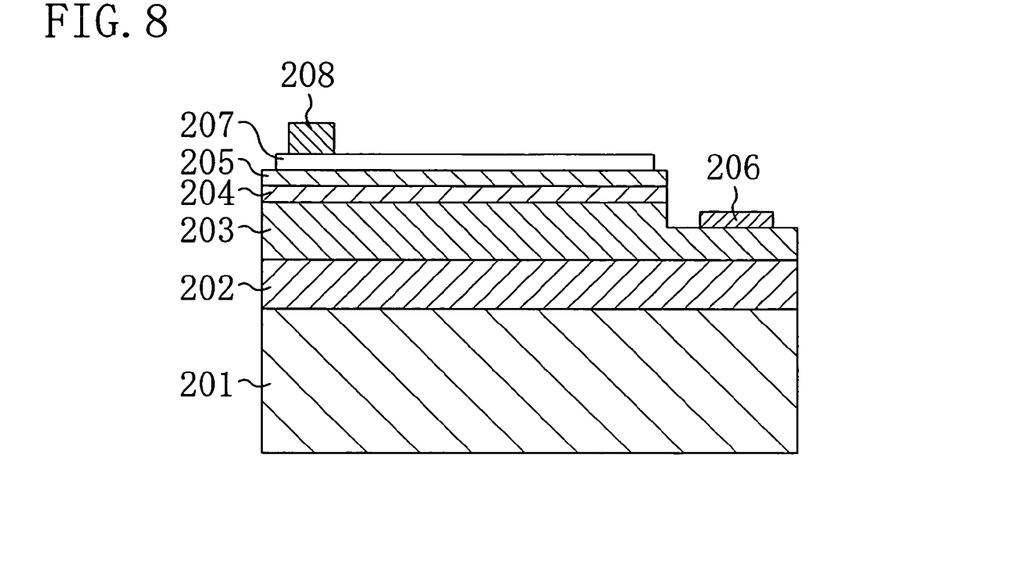
FIG. 8 is a cross-sectional view illustrating a structure of a nitride semiconductor light emitting device according to a second embodiment of the present invention.
Figure 9:
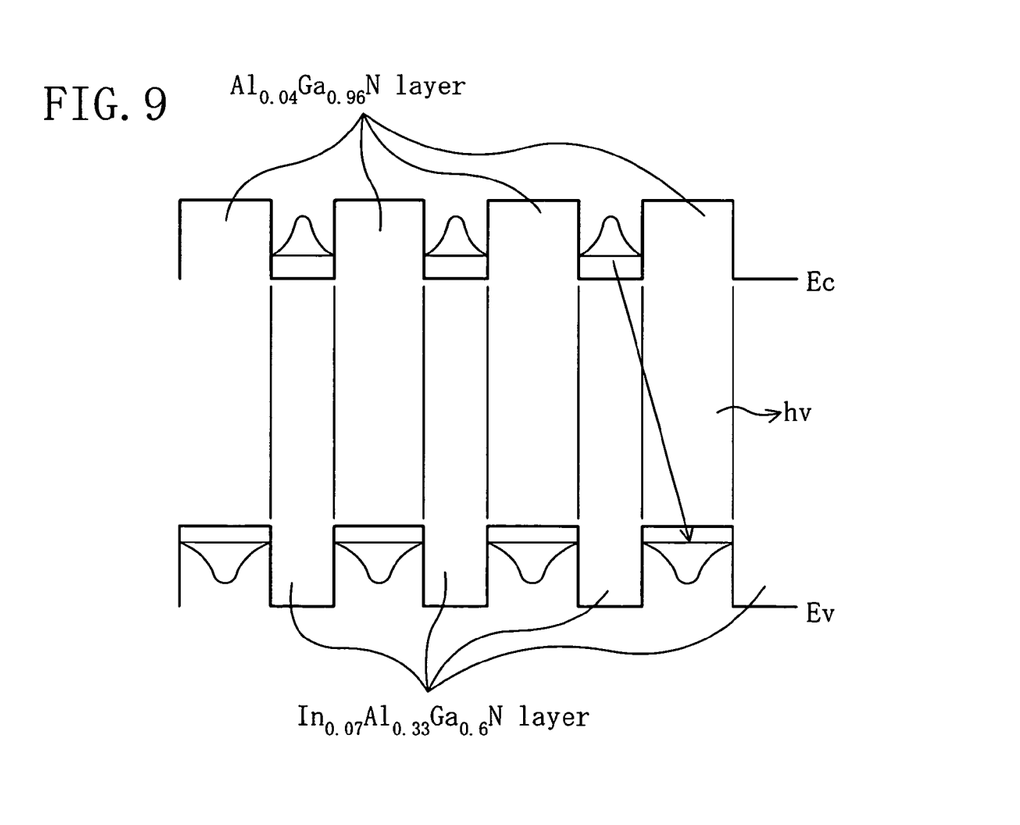
FIG. 9 is a graph showing a band diagram of active layer part of the nitride semiconductor light emitting device of the second embodiment of the present invention.

Hereafter, a second embodiment of the present invention will be described with reference to FIGS. 8 thorough 9. FIG. 8 is a cross-sectional view illustrating a structure of a nitride semiconductor light emitting device according to the second embodiment of the present invention. FIG. 9 is a graph showing a band diagram of active layer part of the nitride semiconductor light emitting device according to the second embodiment of the present invention. In FIG. 8, 201 denotes an R plane sapphire substrate, 202 denotes an n-type GaN layer, 203 denotes an n-type $Al_{0.1}Ga_{0.9}N$ cladding layer, 204 denotes an $In_{0.07}Al_{0.33}Ga_{0.6}N/Al_{0.04}Ga_{0.96}N$ multiple quantum well active layer, 205 denotes a p-type $Al_{0.1}Ga_{0.9}N$ cladding layer, 206 denotes a Ti/Al/Ni/Au electrode, 207 denotes a Ni/Au transparent electrode and 208 denotes an Au electrode.

In this embodiment, a nitride semiconductor layer having a surface of an a plane, i.e., (11-20) plane is epitaxially grown on a sapphire substrate having a surface of an R plane, i.e., (1-102) plane. The a plane is a so-called nonpolar plane in which group III atoms and N atoms mixedly exist in equal numbers. In the nonpolar plane, polarization is not generated in the plane direction.

The nitride semiconductor light emitting device of the second embodiment is different from the nitride semiconductor light emitting device in that an active layer is formed on a nonpolar plane. Specifically, as shown in FIG. 9, in the nitride semiconductor light emitting device of this embodiment, an internal electric field is not generated in the active layer having an InAlGaN/AlGaN multilayer structure, so that electrons are uniformly distributed in the InAlGaN layer and holes are uniformly distributed in the AlGaN layer. Therefore, highly efficient light emission can be achieved.

Accordingly, in this embodiment, as in the first embodiment, an active layer can be formed with a smaller In composition and under epitaxial growth conditions where lattice mismatch is less caused, so that emission of light having a longer wavelength can be realized without causing degradation of crystal quality of the active layer. Furthermore, since an internal electric field is not generated in the active layer, a spatial distance between electrons and holes can be reduced. Therefore, emission of light having a further longer wavelength can be achieved at high efficiency.

In each of the first and second embodiments, as a substrate, a C plane or R plane sapphire substrate is used. However, the present invention is not limited thereto but a substrate formed of some other material such as SiC, GaN and Si may be used and also a substrate having some other plane direction may be used. For example, a plane orientation which is inclined at an off angle from a plane such as the (0001) plane, which is a typically used plane, may be used.

Moreover, in each of the first and second embodiments, as a crystal growth method for forming an epitaxial grown layer, MOCVD is used. However, the present invention is not limited thereto but, for example, molecular beam epitaxy (MBE) or hydride vapor phase epitaxy (HVPE) may be used.

Moreover, in each of the first and second embodiments, a nitride semiconductor light emitting device has been described. However, the present invention is not limited to a nitride semiconductor light emitting device but, even if a nitride semiconductor photo detector device using a photo detector layer having the same layer structure as that of the active layer shown in either one of the first and second embodiments is used, the same effects as those of the present invention can be achieved. Specifically, light detection efficiency of a nitride semiconductor photo detector device to which the present invention is applied can be improved not only for light in a wavelength region of the ultraviolet region or the blue violet region but also for light in a wavelength region of a longer wavelength than that of the ultraviolet or blue violet region.

As has been described, a nitride semiconductor device according to the present invention is applicable to nitride semiconductor light emitting device such as a light emitting diode and a semiconductor laser of the visible region, or a nitride semiconductor photo detector device of the visible region and is, therefore, very useful.

What is claimed is:

1. A nitride semiconductor device comprising an active layer including a first nitride semiconductor layer and a second nitride semiconductor layer periodically stacked, the second nitride semiconductor layer having a different composition from a composition of the first nitride semiconductor layer, wherein an energy at a lower edge of a conduction band in the first nitride semiconductor layer is lower than an energy at a lower edge of a conduction band in the second nitride semiconductor layer, an energy at an upper edge of a valence band in the first nitride semiconductor layer is lower than an energy at an upper edge of a valence band in the second nitride semiconductor layer, and the first nitride semiconductor layer is a quaternary alloy crystal layer formed of a compound expressed by a general formula of $In_xAl_yGa_{1-x-y}N$ (where $0<x<1$ and $0<y1$).

2. The nitride semiconductor device of claim 1, wherein a bandgap in the first nitride semiconductor layer is the same as a bandgap in the second nitride semiconductor layer.

3. The nitride semiconductor device of claim 1, wherein the active layer is formed over an underlying layer formed on a substrate, and
the first nitride semiconductor layer or the second nitride semiconductor layer is formed so as to be lattice-matched to the underlying layer.

4. The nitride semiconductor device of claim 1, wherein the first nitride semiconductor layer exhibits a different polarization from a polarization in the second nitride semiconductor layer.

5. The nitride semiconductor device of claim 1, wherein the quaternary alloy crystal layer has a composition lattice-matched to a GaN layer.

6. The nitride semiconductor device of claim 5, wherein a y/x value is within the range from 3.5 to 3.7.

7. The nitride semiconductor device of claim 1, wherein the first nitride semiconductor layer and the second nitride semiconductor layer are stacked on a nonpolar plane containing nitride atoms and group III atoms in equal numbers.

8. The nitride semiconductor device of claim 3, wherein the substrate is formed of sapphire, SiC or a compound expressed by a general formula of $In_xAl_yGa_{1-x-y}N$ (where $0 \leq x \leq 1$ and $0 \leq y \leq 1$), and
the underlying layer is formed of GaN.

9. The nitride semiconductor device of claim 1, wherein each of the first nitride semiconductor layer and the second nitride semiconductor layer has a surface of a (0001) plane.

10. The nitride semiconductor device of claim 7, wherein each of the first nitride semiconductor layer and the second nitride semiconductor layer has a surface of a (11-20) plane or a (1-100) plane.

11. The nitride semiconductor device of claim 7, wherein each of the first nitride semiconductor layer and the second nitride semiconductor layer has a surface of a (11-20) plane, and
the first nitride semiconductor layer and the second nitride semiconductor layer are formed over the sapphire substrate including a surface of a (1-102) plane.

12. The nitride semiconductor device of claim 1, wherein a cladding layer having a lower refractive index than a refractive index of part of the active layer for practically emitting light which exhibits a maximum refractive index is formed over and under the active layer.

13. The nitride semiconductor device of claim 12, wherein the cladding layer is a binary alloy crystal layer or a ternary alloy crystal layer formed of a compound expressed by a general formula of $Al_xGa_{1-x}N$ (where $0 < x \leq 1$).

14. A nitride semiconductor device comprising an active layer including a first nitride semiconductor layer and a second nitride semiconductor layer periodically stacked, the second nitride semiconductor layer having a different composition from a composition of the first nitride semiconductor layer,
wherein an energy at a lower edge of a conduction band in the first nitride semiconductor layer is lower than an energy at a lower edge of a conduction band in the second nitride semiconductor layer,
an energy at an upper edge of a valence band in the first nitride semiconductor layer is lower than an energy at an upper edge of a valence band in the second nitride semiconductor layer,
a lattice constant of the first nitride semiconductor layer is different from a lattice constant of the second nitride semiconductor layer, and
the second nitride semiconductor layer is a binary alloy crystal layer or a ternary alloy crystal layer formed of a compound expressed by a general formula of $Al_xGa_{1-x}N$ (where $0 \leq x \leq 1$) or is a binary alloy crystal layer or a ternary alloy crystal layer formed of a compound expressed by a general formula of $In_xGa_{1-x}N$ (where $0 < x \leq 1$).

* * * * *